United States Patent [19]

Kayser et al.

[11] Patent Number: 5,265,003
[45] Date of Patent: Nov. 23, 1993

[54] MINIATURIZED SWITCHING POWER SUPPLY WITH PROGRAMMED LEVEL GATE DRIVE

[75] Inventors: Kenneth W. Kayser, St. Charles, Ill.; Joel C. Van Antwerp, Bullard, Tex.

[73] Assignee: Power Trends, Batavia, Ill.

[21] Appl. No.: 557,922

[22] Filed: Jul. 25, 1990

[51] Int. Cl.⁵ .............................................. H02M 1/08
[52] U.S. Cl. .................................. 363/131; 307/566; 307/571; 307/318; 323/351
[58] Field of Search .......................... 363/20, 21, 131; 323/282, 288, 289, 351; 307/571, 555, 566, 318

[56] References Cited

U.S. PATENT DOCUMENTS 4,847,546  7/1989  Bobier et al. ........................ 320/21
4,970,620  11/1990  Lehnhoff et al. ..................... 361/18

FOREIGN PATENT DOCUMENTS 194857  8/1989  Japan .
111257  4/1990  Japan .
179262  7/1990  Japan .

Primary Examiner—William H. Beha, Jr.
Attorney, Agent, or Firm—Hill, Steadman & Simpson

[57] ABSTRACT

A miniaturized switching power supply has an output circuit for supplying gate drive to a power FET. The output circuit incorporates a pair of series connected transistors with a zener diode connected to the base of one of the transistors to limit the gate drive to the FET.

3 Claims, 3 Drawing Sheets

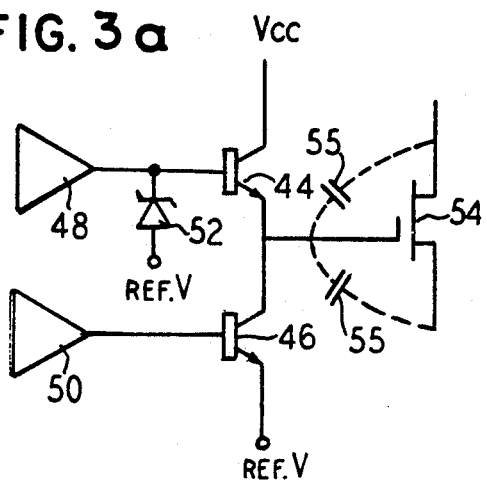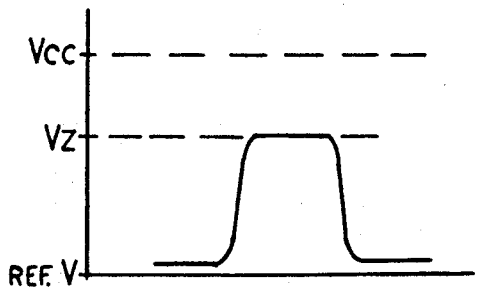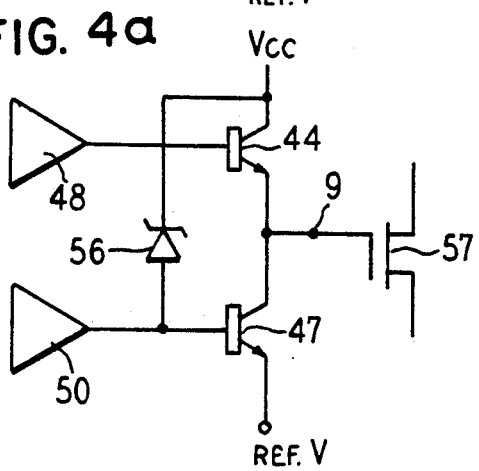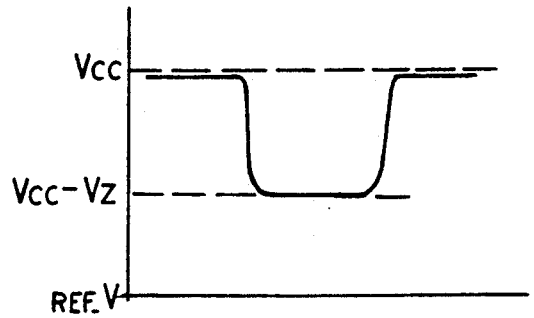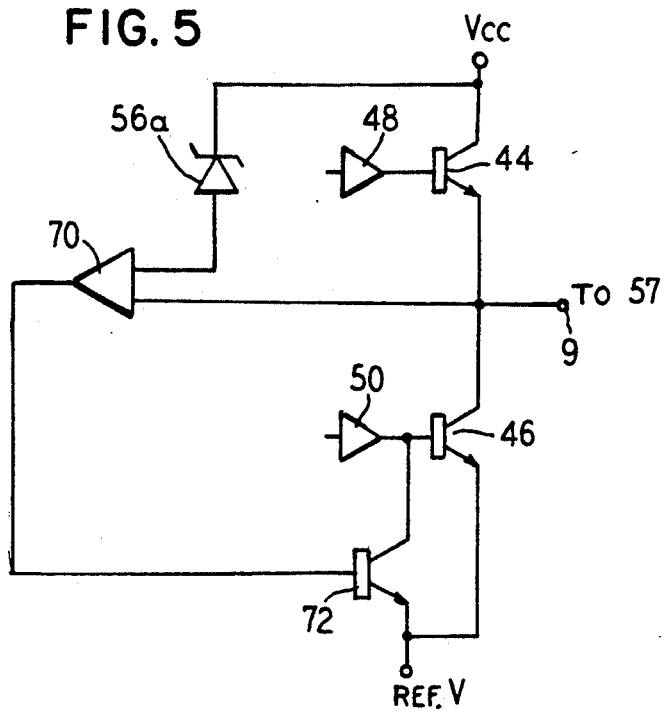

/ 5,265,003 /

MINIATURIZED SWITCHING POWER SUPPLY WITH PROGRAMMED LEVEL GATE DRIVE

BACKGROUND OF THE INVENTION

The present invention relates to a miniaturized switching power supply regulator and its control circuitry, and more particularly to one in which the drive from the output amplifier is controlled at a pre-programmed level.

A major difficulty in the miniaturization of the switching power supply control is the heat dissipation from losses within the power supply circuit. These losses result from a number of factors, and efforts have been made to control them. One significant factor which has not been heretofore recognized is the need for control of the gate drive levels of the final output power unit of the switching power supply, viz., a power FET. It is desirable to reduce the size of the switching power supply to approximately the size and shape of a standard IC, so that little circuit board space is required, and connection of the switching power supply is made readily by means of terminals or pins, and conventional assembly equipment may be used for assembling the power supply with the other circuit components. However, a problem in reducing the size of switching power supplies to this level is that the heat dissipation is so great as to put a lower limit on the size which can be achieved, due to inefficiencies in the circuit. Specifically, when the gate is driven beyond the point at which the drain switches, excess energy is dissipated.

One of the inefficiencies contributing to excess heat within the circuit is excess drive applied to the gate of the final control FET.

It is accordingly desirable to provide a mechanism for limiting the gate drive of this unit, so that excess power dissipation can be reduced.

SUMMARY OF THE INVENTION

It is a principal object of the present invention to provide a mechanism for controlling the output to the gate of the output FET of a miniaturized switching power supply, to reduce the power dissipating within the circuit.

Another object of the present invention is to provide an improved miniature switching power supply circuit in which the turn-off time of the output power FET is reduced, as a consequence of which the power dissipation within the circuit is reduced.

In accordance with one embodiment of the invention, there is provided a programmable gate drive for a FET in a miniaturized switching power supply incorporating first and second transistors connected in series between a positive voltage source and a reference voltage source, means for connecting a point intermediate said first and second transistors to the gate of a power FET, means for driving the bases of each of said first and second transistors with signals so as to turn on and turn off said power FET at predetermined times during plural cycles of operation, and means for limiting the voltage level at the base of one of said first and second transistors, whereby the turn on drive supply to the power FET is limited to a level consistent with optimum performance of the power FET, where any increase in drive level would not result in a reduction of the on-resistance of the drain-source current path.

Other objects and advantages of the invention will become manifest on inspection of the following specification and the accompanying drawings.

BRIEF DESCRIPTION OF THE DRAWINGS

Reference will now be made to the accompanying drawings in which:

FIGS. 3a and 3b are a schematic circuit diagram of a programmable gate drive constructed in accordance with the present invention, used for driving a gate of an N-channel FET and a diagram showing the gate voltage;

FIGS. 4a and 4b are a schematic circuit diagram of a programmable gate drive incorporating the present invention for use in connection with a P-channel FET and a diagram showing the gate voltage; and FIG. 5 is a functional block diagram of an embodiment of the present invention using a comparator and a p-channel FET;

DESCRIPTION OF THE PREFERRED EMBODIMENT

Figure 1:
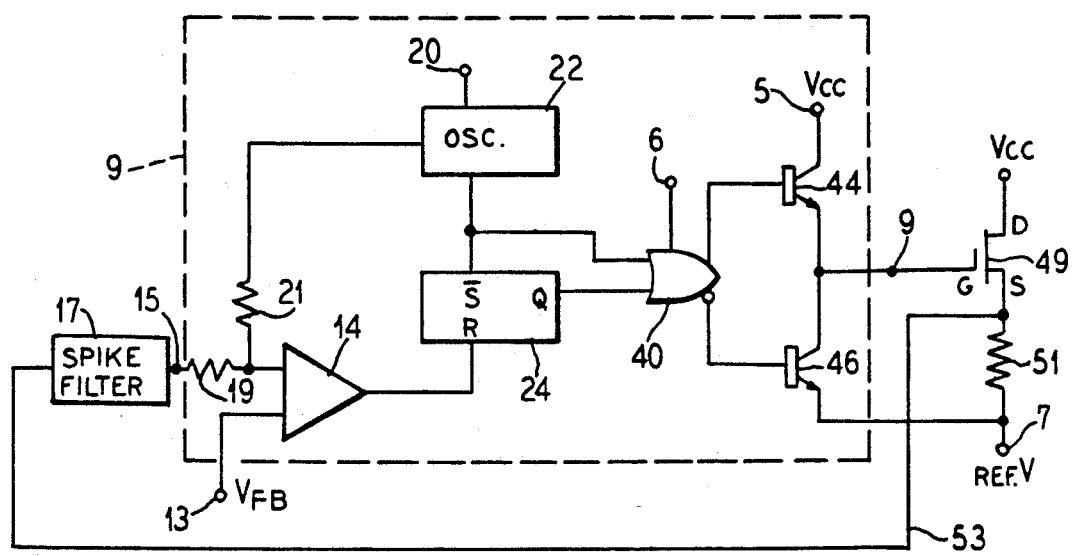
FIG. 1 is a functional block diagram of a switching power supply control section incorporating an illustrative embodiment of the invention and using an N-channel FET.

Reference will now be made to FIG. 1, which illustrates a diagram of a miniaturized switching power supply. The power supply is embodied as an integrated circuit 9, having a number of pins or terminals for access to circuits outside the IC. A source of feedback voltage is connected to a pin 13 and thence to one input of a comparator 14, and the other input of the comparator 14 is connected to pin 15, which receives a positive feedback voltage through a spike filter 17 and a resistor 19. Positive feedback voltage is developed from a sensing unit which senses the output voltage of the power supply as compared to a desired reference voltage. As shown in FIG. 1, a resistor 51 is connected in series with the drain-source current path of an N-channel FET 49. The voltage developed across the resistor 51 is connected by a line 53 to the input of the spike filter 17, which smoothes the feedback signal. Another current feedback circuit may be used in place of the resistor 51. An RS flip-flop 24 is provided which has its reset input connected to the comparator 14 and its set input connected to the output of an oscillator 22, which has a control input connected to a pin 20. The oscillator 22 provides setting signals to the flip-flop 24, and a ramp signal which is added to the current feedback signal, through a resistor 21, which forms a summing network with the resistor 19. The duty cycle of the flip-flop 24, as well as the pulse repetition rate of output pulses from its output, are dependent on the frequency of operation of the oscillator 22, as well as operation of the comparator 14.

The output of the flip-flop 24 is connected to one input of an OR gate 40, which has another input connected to the output of the oscillator 22. It receives power from $V_{cc}$ at pin 6.

The OR gate 40 provides two inverse outputs, i.e. true, and inverted outputs, which are connected to the bases of two series-connected transistors 44 and 46, and pin 9 is connected to a point between the two transistors 44 and 46. Pin 9 supplies the gate voltage to an FET 49 which operates as the power controlling unit. The FET 49 is an N-channel FET as shown in FIG. 1, or a P-channel FET, shown in FIG. 2, which is described in more detail hereinafter. The transistors 44 and 46 are connected in series between pins 5 and 7, which are connected to voltage sources. Pin 7 may be connected to a ground reference voltage or to another source of reference voltage less than that connected to pin 5.

FIG. 3a illustrates a schematic diagram of the present invention used in connection with an N-channel FET. The transistors 44 and 46 of FIG. 1 are also shown in FIG. 3a, as 44 and 46. They are connected in series between $V_{cc}$ and reference. The base drive signals for the two transistors originate with amplifiers 48 and 50, respectively. The amplifiers 48 and 50 may be embodied in the OR gate 40, or may be provided as additional components. A zener diode 52 is connected from the base of the transistor 44 to ground, and the common connection between the emitter of the transistor 44 and the collector of the transistor 46 is connected to pin 9 to furnish the gate drive signal for the N-channel FET 49.

Presence of the zener diode 52 at the base of the transistor 44 prevents the base voltage of the transistor 44 from rising above a predetermined value, approximately equal to the zener voltage of the zener diode 52. This prevents the gate voltage on pin 9 from rising above the optimum voltage level for controlling the gate of the N-channel FET. This avoids excess enery in charging the gate, as well as excess power dissipation in the transistors 44 and 46 and the FET 54, so as to hold the power dissipation of the circuit to a minimum consistent with optimum operation of the N-channel FET. FIG. 3b illustrates that the gate voltage can rise only to the level $V_z$, from the reference voltage.

In addition, there is a parasitic capacitance 55 between the gate of the N-channel FET and its source and drain terminals. This capacitance must be charged and discharged, during turn-on and turn-off of the FET, and since the gate drive is limited, the charge on these capacitors is also limited, whereby the time required for a charge and discharge of them is reduced. Therefore, power dissipation is reduced, and efficiency is increased.

It has been found that a zener diode having a zener voltage of about 12V is optimum for an average power FET.

Figure 2:
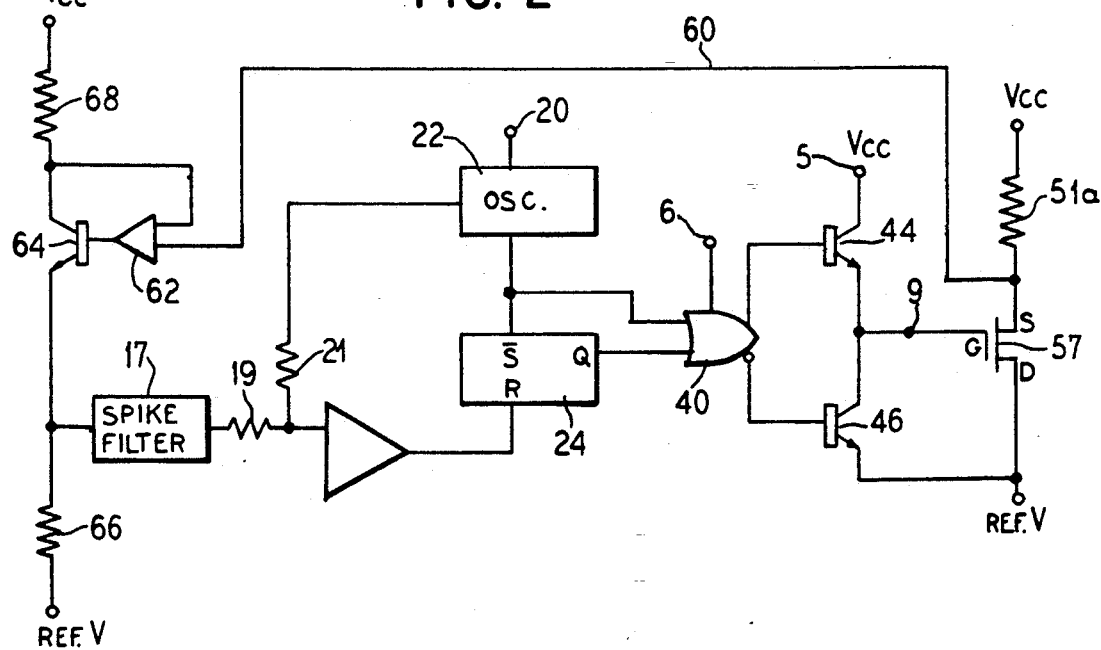
FIG. 2 is a schematic circuit diagram of a switching power control section incorporating an alternative embodiment of the invention using a P-channel FET.

A circuit of FIG. 2 is similar to the circuit of FIG. 1, except that a P-channel FET 57 is employed, and a feedback resistor 51A is connected between the transistor 57 and the source $V_{cc}$. The junction between the resistor 51a and the transistor 57 is connected by line 60 to the input of an operational amplifier 62, which drives the base of a NPN transistor 64. The other input of the operational amplifier 62, and the collector of the transistor 64 are connected to $V_{cc}$ to a resistor 68, and the emitter of the transistor 64 is connected to the input of the spike filter 17, and through a resistor 66 to a reference potential. By this means, a feedback voltage of the proper polarity is obtained for cooperation with the P-channel FET 57.

FIG. 4a shows a circuit employed for driving the P-channel FET. The transistors 44 and 47 are the same as the transistors 44 and 46 illustrated in FIG. 3a, except that they are NPN and PNP transistors, respectively. They are driven by the amplifiers 48 and 50 respectively. As in FIG. 3a, the collector of the transistor 44 is connected to $V_{cc}$, and the emitter of the transistor 47 is connected to reference.

A zener diode 56 is connected from $V_{cc}$ at the collector of the transistor 44, to the base of the transistor 47. As in FIG. 3a, the terminal 9 is connected to the gate of the FET, but in this case it is a P-channel FET 57.

The zener diode 56 prevents the base of the transistor 47 from being driven above a predetermined voltage level, approximately equal to $V_{cc}$ — the zener voltage, consistent with optimum operation of the P-channel FET 57. This reduces power dissipation in the circuit, when it is used to drive a P-channel FET by the same mechanism described above in connection with FIG. 3a. FIG. 4b illustrates that the gate voltage can fall, from the V level, only to the level $V_{cc} - V_z$.

It has been found that a zener diode having a zener voltage of about 12V is optimum for an average power FET.

Referring to FIG. 5, an alternative circuit is illustrated for driving a P-channel FET, which does not require the use of the PNP transistor 46a. In the arrangement illustrated in FIG. 5, NPN transistors 44 and 46 are driven by amplifiers 48 and 50, with their common connection connected to terminal 9 which is connected to the gate of the P-channel FET 57. The terminal 9 is also connected to one input with an operational amplifier 70, the other input of which is connected to $V_{cc}$ through a zener diode 56a. The output of the operational amplifier 70 is connected to the base of a NPN transistor 72, having its collector connected to the output of the amplifier 50, and its emitter connected to reference potential.

The operational amplifier 70 furnishes a signal to the transistor 72, which sends the output of the amplifier 50 to ground when the gate of the transistor 72 is high relative to the reference potential. This occurs only when the voltage at pin 9 is less than a voltage level corresponding to $V_c$ less the zener voltage of the zener diode 56a. In this way, the drive to pin 9 is limited.

Figure 6:
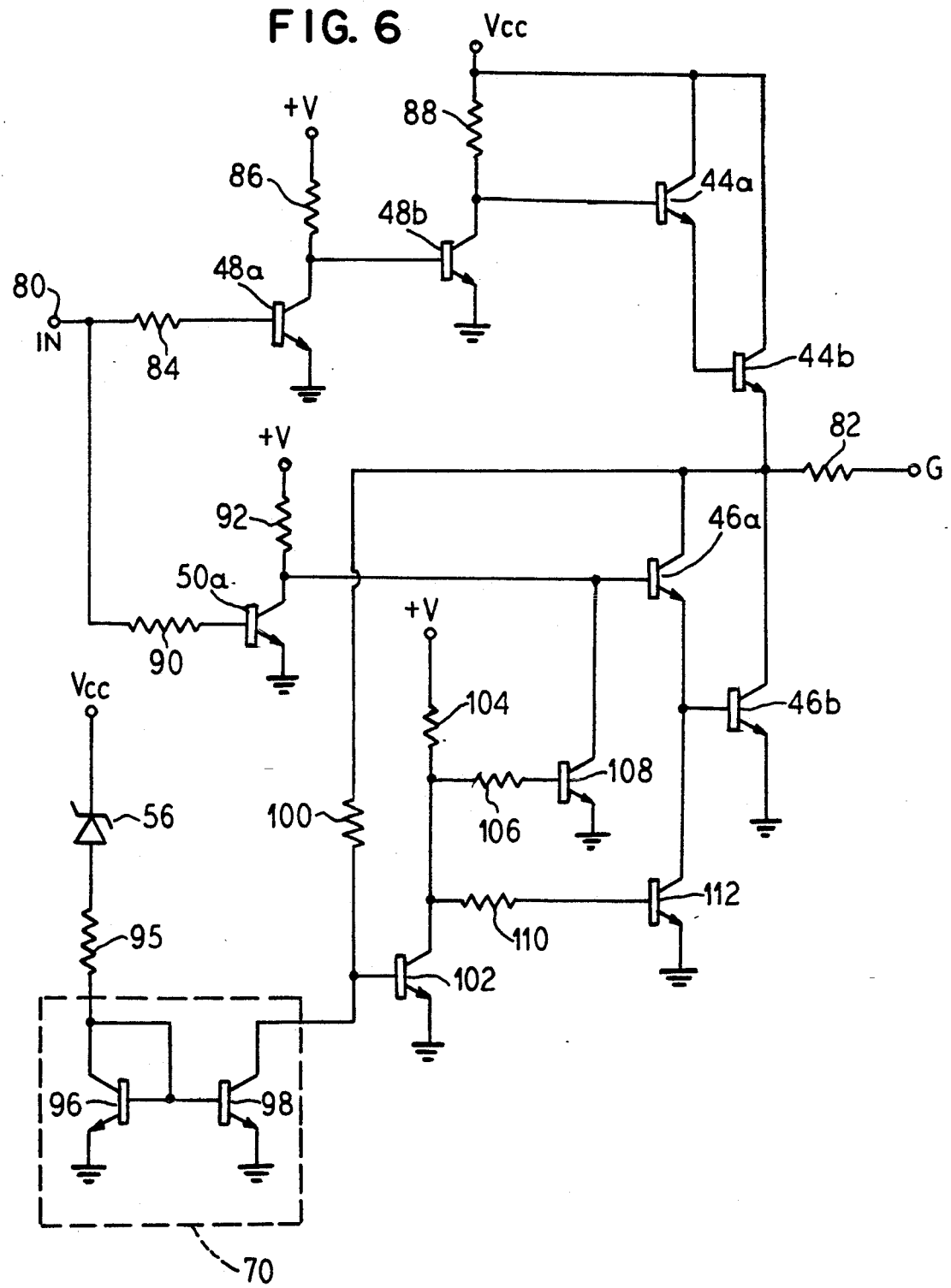
FIG. 6 is a schematic circuit diagram of the apparatus of FIG. 5.

FIG. 6 illustrates a schematic diagram of a circuit by which the arrangement of FIG. 5 may be constructed in integrated circuit form. A darlington pair is substituted for each of the NPN transistors 44 and 46. The NPN transistors 44a and 44b make up the darlington pair substituted for the upper transistor 44, and transistors 46a and 46b are substituted for the lower transistor 46.

The darlington pairs are connected in series between the potential $V_{cc}$ and reference potential, and the common connection between them is connected through a resistor 82 to the gate terminal of the p-channel FET. An input signal supplied to terminal 80, and is amplified by common emitter connected transistor 48a and 48b and supplied to the input of a upper darlington pair. An input resistor 84 is connected between the input terminal 80 and the base of the transistor 48a. The collector of the transistor 48a is connected to the base of the transistor 48b and through a resistor 86 to a source of positive potential. The collector of the transistor 48b is connected to the input of the transistor 44a and through resistor 88 to $V_{cc}$. The input 80 is also connected through a common emitter transistor 50a to the input of the lower darlington, viz., the base of transistor 46a. An input resistor 90 interconnects the input terminal 80 with the base of the transistor 50a, and its collector is connected to the base of the transistor 46a and through a resistor 92 to a source of positive potential. It will be evident that the transistor 50 inverts the input signal, so that the drive on the lower darlington pair 46a and 46b is the inverse of the drive supplied to the upper darlington pair 44a and 44b.

A constant current arrangement incorporates resistor 95 and transistor 96, so that a constant base current is supplied to the base of the NPN transistor 98. The transistor 98 has its emitter connected to the reference potential, and its collector connected through a resistor 100 to the common junction of the two darlington pairs, and to the base of a NPN transistor 102. The transistors 96 and 98, with resistors 95 and 100, make up a comparator in the form of a current mirror, which achieves a response time of about 10 nsec.

The transistor 102 has its collector connected through a resistor 104 to a source of positive potential, through a resistor 106 to the base of a NPN transistor 108, and through a resistor 110 to the base of a transistor 112. The emitters of the transistors 108 and 112 are both connected to reference potential, and their collectors are connected respectively to the bases of the transistors 46a and 46b making up the lower darlington pair. In normal operation, the transistor 102 is conductive, which pulls down the voltage level present at its collector, so that the transistors 108 and 112 are both held cut off. This operation continues as long as the gate voltage, and the voltage at the junction of the upper and lower darlington pairs is above a predetermined level, such that sufficient current flows through the resistor 100 to keep the transistor 102 turned on.

When the gate voltage falls below a predetermined level, however, the current through the resistor 100 is reduced, and the transistor 102 becomes cut off. At this point, the voltage at its collector arises, allowing the transistors 108 and 112 to become conductive. This tends to reduce the voltage levels at the bases of the transistors 46a and 46b, thereby tending to reduce current flowing through the lower darlington pair, and therefore tending to maintain the voltage level at the gate terminal g.

The constant base current through the transistor 98 sets the level at which the transistor 102 can be rendered conductive or cut off. This base current is set by virtue of the zener diode 56, and the resistor 95 connected between the zener diode 56 and the transistor 96. When a diode 56 is chosen with a zener voltage of 12 volts, the other circuit values, such as the resistors 95 and 100, can be readily chosen so that the gate voltage at the terminal G is able to fall only to a predetermined voltage level, which corresponds to the gate of the p-channel FET being equal to the voltage at which any further reduction would not result in substantial change in conductivity of the drain-source path of the p-channel FET.

The preferred range of the zener voltage of the zener diode is 7V to 15V, dpending on the design voltage of the power supply. It is desirable to have the zener voltage somewhat less than the design power supply voltage, to allow for overshoot. In one case, a zener voltage of 7 volts was determined to be optimum for an output voltage of 12 volts. For other output voltages, the optimum zener voltage may be readily determined.

It is apparent that by use of the present invention, a simple and economical circuit is provided by which power dissipation of a miniaturized power supply is reduced, enabling the volume of the miniature power supply to be reduced without having to run at an increased temperature, and improving efficiency of operation of the circuit.

What is claimed is:

1. A programmable gate drive for a switching power supply incorporating first and second transistors connected in series between a positive voltage source and a reference voltage, said first and second transistors comprising a PNP and NPN transistor respectively,
    means for connecting a point intermediate said first and second transistors to a gate of a power FET, said power FET serving to regulate the voltage supplied at an output of the switching power supply,
    means for driving the bases of each of said first and second transistors with signals so as to turn on and turn off said power FET at predetermined times during plural cycles of operation, and zener diode means for limiting the voltage level at the base of one of said first and second transistors, to limit the drive supplied to the power FET to a predetermined level, and said zener diode being connected between a source of potential and the base of one of said first and second transistors.

2. A programmable gate drive for a switching power supply incorporating first and second transistors connected in series between a positive voltage source and a reference voltage,
    means for connecting a point intermediate said first and second transistors to a gate of a power FET, said power FET serving to regulate the voltage supplied at an output of the switching power supply,
    means for driving the bases of each of said first and second transistors with signals so as to turn on and turn off said power FET at predetermined times during plural cycles of operation, and means for limiting the voltage level at the base of one of said first and second transistors to limit the drive supplied to the power FET to a predetermined level;
    said first and second transistors comprising NPN and PNP transistors, respectively, and said limiting means comprising a zener diode interconnected between the collector of said NPN transistor and the base of PNP transistor.

3. A programmable gate drive for a switching power supply incorporating first and second transistors connected in series between a positive voltage source and a reference voltage,
    means for connecting a point intermediate said first and second transistors to a gate of a power FET, said power FET serving to regulate the voltage supplied at an output of the switching power supply,
    means for driving the bases of each of said first and second transistors with signals so as to turn on and turn off said power FET at predetermined times during plural cycles of operation, and means for limiting the voltage level at the base of one of said first and second transistors to limit the drive supplied to the power FET to a predetermined level;
    said first and second transistors comprising a PNP and NPN transistor, respectively, and said limiting means comprising a zener diode having a zener voltage of about 12 volts connected between a source of potential and the base of one of said first and second transistors.

* * * * *